United States Patent [19]
Hamzehdoost et al.

[11] Patent Number: 5,371,321
[45] Date of Patent: Dec. 6, 1994

[54] PACKAGE STRUCTURE AND METHOD FOR REDUCING BOND WIRE INDUCTANCE

[75] Inventors: Ahmad Hamzehdoost, Sacramento; Chin-Ching Huang, San Jose, both of Calif.

[73] Assignee: VLSI Technology, Inc., San Jose, Calif.

[21] Appl. No.: 918,816

[22] Filed: Jul. 22, 1992

[51] Int. Cl.$^5$ ............................................. H01L 23/02
[52] U.S. Cl. ...................................... 174/52.4; 29/832
[58] Field of Search .................. 174/52.4, 51, 52.1, 174/52.3; 29/825, 830, 831, 832, 841

[56] References Cited

U.S. PATENT DOCUMENTS

| | | | |
|---|---|---|---|
| 3,872,583 | 3/1975 | Beall et al. | 29/624 |
| 4,288,841 | 9/1981 | Gogal | 361/414 |
| 4,626,958 | 12/1986 | Lockard et al. | 361/306 |
| 4,831,495 | 5/1989 | Harding | 361/386 |

*Primary Examiner*—Leo P. Picard
*Assistant Examiner*—Christopher Horgan
*Attorney, Agent, or Firm*—Patrick T. King

[57] ABSTRACT

A package assembly for an integrated circuit die includes a base having a cavity formed therein for receiving an integrated circuit die. The base has a ground-reference conductor. A number of bonding wires are each connected between respective die-bonding pads on the integrated circuit die and corresponding bonding pads formed on the base. The lid has an electrically conductive layer formed on it to cover the integrated circuit die in the cavity formed in the base. The electrically conductive layer formed on the lid is positioned in close proximity to some of the plurality of bonding wires. The electrically conductive layer formed on the lid is connected to the ground-reference conductor of the base. This arrangement reduces both the self-inductances of the one or more conductors and the mutual inductance between the one or more conductors. With this arrangement the electrically conductive layer formed on the lid is grounded to reduce interference being radiated from the electrically conductive layer.

15 Claims, 4 Drawing Sheets

PACKAGE STRUCTURE AND METHOD FOR REDUCING BOND WIRE INDUCTANCE

BACKGROUND OF THE INVENTION

1. Field of the Invention

This invention relates to packaging for integrated circuit chips and, more particularly, to packaging techniques which provide improved electrical connections to an integrated circuit chip package.

2. Prior Art

Traditional package assemblies for high-performance integrated circuit packages are made of high quality ceramic materials. These packages are sealed with a lid which is electrically isolated from other electrical conductors associated with the package assembly. Often, these lids are formed of a metal or other material which is covered with a conductive material, for example, Kovar plated with gold.

It has been found that, at high frequencies, an electrically isolated, conductive lid may have some operational disadvantages. In terms of electromagnetic interference, the electrically isolated lid of the package functions as a conductive body which may, in effect, function as an antenna radiating electromagnetic interference (EMI) into the integrated circuit assembly when the integrated circuit is operated at high frequencies.

It has also been found that the self-inductance of the bonding wires and the mutual inductance between bonding wires are significant and can limit the electrical performance of an integrated circuit, particularly at high frequencies. In high performance ceramic pin-grid-array (HPCPGA) packages, the inductance of the bonding wires is a large portion of the overall inductance of a package. Since the bonding wires float with no ground plane nearby, the inductance of the bonding wires is relatively high.

With the advances in integrated circuit design and fabrication techniques, integrated circuits are operating at ever higher frequencies so that a need exists for reducing lead inductances and electromagnetic interference.

SUMMARY OF THE INVENTION

It is therefore an object of the invention to provide a technique for reducing lead inductances and electromagnetic interference in an integrated circuit package.

In accordance with this and other objects of the invention, the invention provides a method for reducing the self-inductance and mutual inductance of the leads in an integrated circuit package. The method of the invention also provides for reducing the amount of electromagnetic energy radiated from an ungrounded, conductive lid of an integrated circuit package. The invention uses a metal lid as a VSS ground plane to reduce the self-inductance and the mutual inductance of the bonding wires. Grounding of the lid reduces electromagnetic energy being picked up and radiated from the lid.

The improved package assembly for an integrated circuit die includes a base to which the integrated circuit die is fixed. The base has a ground-reference conductor. In one embodiment of the invention the base includes multilevel conductors for providing electrical connections between input/output terminals or pins and the bonding pads on the base. One or more bonding wires for the integrated circuit die are connected between respective bonding pads on the integrated circuit die and corresponding bonding pads on the base. A conductive lid overlies the one or more bonding wires for the integrated circuit die. The invention provides connection means for electrically connecting the conductive lid to the ground-reference conductor so that the electrically conductive lid reduces both the self-inductances of the one or more bonding wires and the mutual inductance between the one or more bonding wires; and, also, so that the electrically conductive layer formed on the lid is grounded to reduce interference being radiated from the electrically conductive layer.

In one embodiment of the invention, the base is a nonconductive base having a ground-reference conductor, and the connection means includes conductive vias formed in the base where the conductive vias are connected to conductive means for fixing the conductive lid to the base and the ground-reference conductor of the base, so that the conductive lid is electrically connected to the ground reference conductor of the base.

In another embodiment of the invention, the base is for a ceramic pin-grid-array (PGA) package having a number of connection pins extending through a ceramic base, and the connection means further includes a conductive tab member formed on the surface of the ceramic base for the ceramic pin-grid-array (PGA) package. The conductive tab member connects the conductive lid at one of the connection pins.

In another embodiment of the invention, the base has the integrated circuit die fixed to a die-attach paddle of a lead frame connected to a multilevel printed circuit board where the lead frame includes bonding fingers to which respective bonding wires are bonded. Connection means are provided for fixing the conductive lid to the multilevel printed circuit board. The connection means includes conductive plated-through holes formed in the multilevel printed circuit board, so that the conductive lid is electrically connected to the ground reference conductor.

A method for packaging an integrated circuit, according to the invention, includes the steps of mounting an integrated circuit die within a cavity formed in a base of a package, where the base has a ground-reference conductor connecting the integrated circuit die to the base with one or more bonding wires; fixing a conductive lid over the integrated circuit die in close proximity to the one or more bonding wires; and electrically connecting the electrically conductive lid to the ground-reference conductor of the base so that the electrically conductive lid reduces both the self-inductances of the one or more bonding wires and the mutual inductance between the one or more bonding wires, and also so that the electrically conductive layer formed on the lid is grounded to reduce interference being radiated from the electrically conductive layer.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
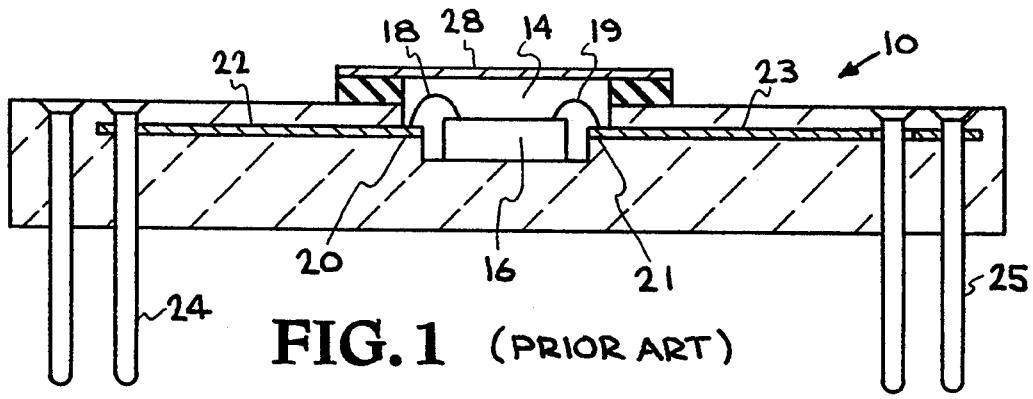
FIG. 1 is a sectional elevation view of an integrated circuit package assembly which uses a conventional, electrically-isolated conductive lid.

FIG. 1 illustrates (not to scale) a conventional integrated circuit package assembly 10. The package assembly 10 includes a base 12 formed of a nonconductive, hermetic material such as, for example, ceramic, molded plastic, or other suitable material. In this example, the base 12 is formed of a ceramic material. A cavity 14 is formed in the base 12 to receive an integrated circuit die 16. A number of bonding wires (typically shown as 18, 19) are each connected between respective bonding pads on the integrated circuit die 16 and corresponding respective bonding pads 20, 21 formed on the base.

The bonding wires (typically shown as 18, 19) have their own self-inductance and all of the bonding wires have mutual inductances between the various wires. These inductances become important as the integrated circuits on the die 14 operate at higher frequencies. The inductance of an isolated wire, which is 150 mils long and 1 mil in diameter, is 4.2 nH, calculated using Equation 1 below. The inductance of this wire spaced 10 mils apart from a ground plane is 3.0 nH, calculated using Equation 2.

$$Ls = 5l[ln(2l/r) - \tfrac{3}{4}]nH \qquad \text{(Equation 1)}$$

$$Ls = 5l[ln(2h/r) + \tfrac{1}{4}]nH \qquad \text{(Equation 2)}$$

where:
l = the length of the wire;
r = the radius of the wire; and
h = the distance from the ground plane to the wire.

The bonding pads 20, 21 are connected to respective conductive traces 22, 23, which are internally formed within the ceramic base 12. The conductive traces 22, 23, in turn, are electrically connected to respective pins 24, 25, which extend through respective plated-through holes formed through the base 12.

A metal lid 28 is provided to protect and hermetically seal the integrated circuit die 16 within the cavity 14 in the ceramic base 12. The lid is typically is formed of a metal material, such as gold-plated kovar. Metal is used because it is relatively inexpensive and can be bonded to the ceramic base to provide a hermetically sealed package. The lid 28 is attached and sealed around its peripheral edges to the base 12. Note that metal lid 28 is electrically isolated from the non-conductive base 12. The bonding wires (typically shown as 118, 19) can be in close proximity to the ungrounded lid. As previously mentioned herein above, it has been found that having a large isolated, conductive surface in close proximity to the bonding wires 18, 19 of an integrated circuit package can produce an electromagnetic interference problem for the circuits on the die 16, particularly at high frequencies. The electrically isolated lid of the package is an isolated, conductive body which functions as an antenna which can receive and reradiate high-frequency electromagnetic interference (EMI) into the integrated circuit assembly.

Figure 2:
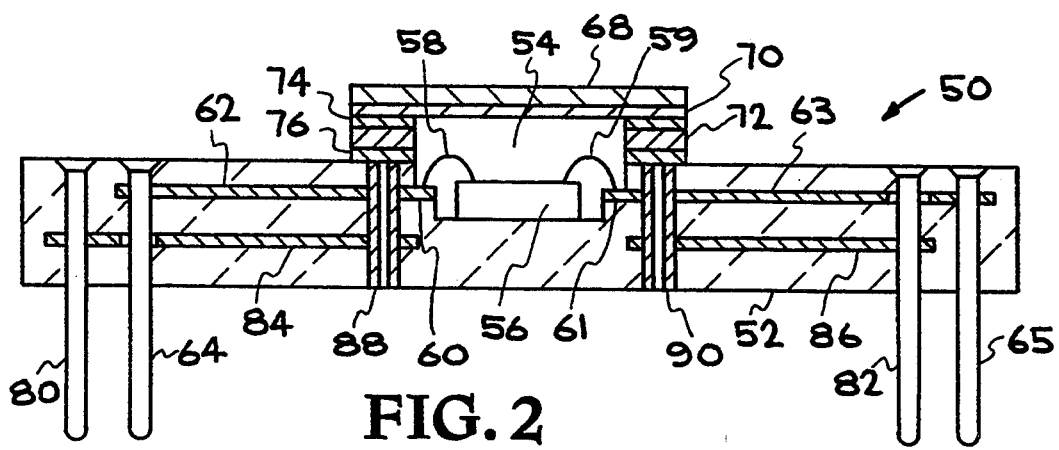
FIG. 2 is a sectional elevation view of an integrated circuit package assembly according to the invention, where the integrated circuit package assembly is provided with an electrically grounded, conductive lid which is connected through conductive vias to package pins connecting a Vss ground potential source to the package.
Figure 3:
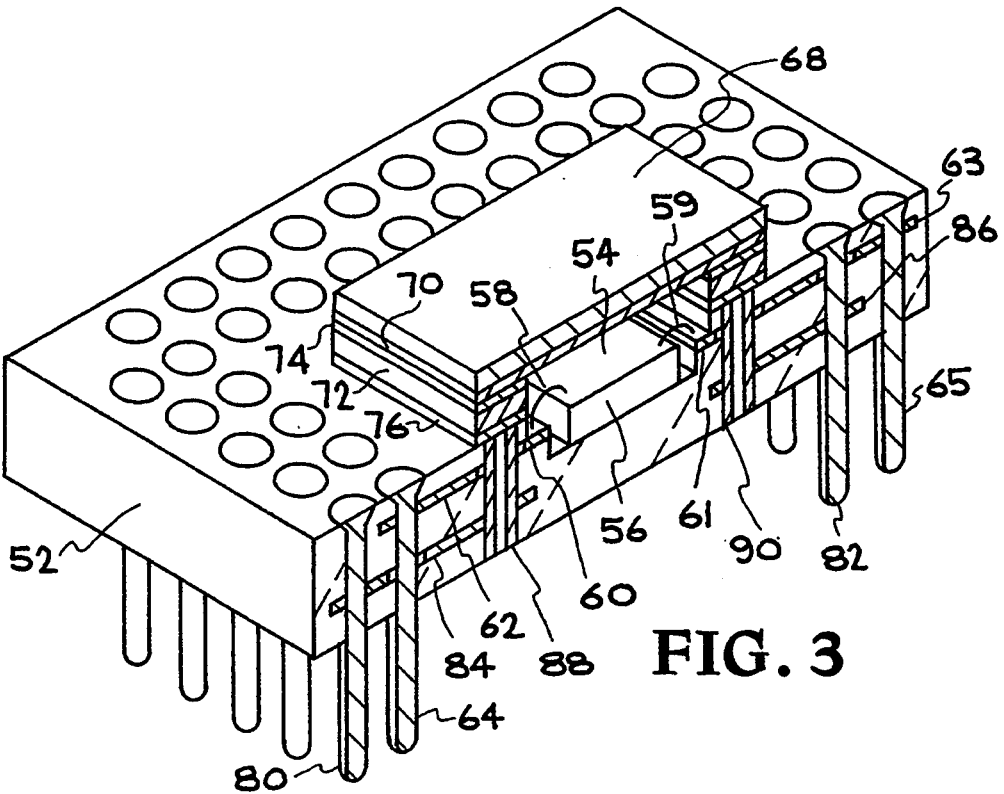
FIG. 3 is an isometric, partially sectional view, taken along section line 3—3 of FIG. 2, of the ceramic package assembly of FIG. 2.

FIG. 2 illustrates (not to scale) an integrated circuit package assembly 50 according to the invention. FIG. 3 is an isometric, partially-sectional view of the package assembly of FIG. 2. This integrated circuit package assembly 50 in some respects is similar to that shown in FIG. 2, with some significant differences, such as, the package assembly 50 uses a conductive lid which is connected to a Vss ground potential source.

With reference to both FIGS. 2 and 3, the package assembly 50 is for a pin-grid-array (PGA) package and includes a base 52 formed of a nonconductive, hermetic material such as, for example, ceramic, molded plastic, polyimide, FR-4 glass-epoxy, or other suitable material. In this example, the base 52 is formed of a ceramic material. A cavity 54 is formed in the base 52 to receive an integrated circuit die 56. A typical package assembly has a large number of bonding wires connected between the die 56 and conductors in the base 52. In FIGURE, 2 bonding wires (typically shown as 58, 59) are shown connected between respective bonding pads on the integrated circuit die 56 and corresponding respective bonding pads 60, 61 formed on the base 52. The bonding pads 60, 61 are connected to respective conductive traces 62, 63, which are internally formed within the ceramic base 52. The conductive traces 62, 63, in turn, are electrically connected to respective pins 64, 65, which extend through respective plated-through holes formed through the base 52.

A conductive metal lid 68 is provided to protect and hermetically seal the integrated circuit die 56 within the cavity 54 in the ceramic base 52. The conductive lid 68 is typically formed of a metal material, such as kovar, with a layer 70 of gold formed on its lower surface. The top surface of an electrically conductive sealing ring 72 is bonded to the layer 70 on the lower surface of the lid 68 with a preformed layer 74 of gold/tin bonding material. The lower surface of the electrically conductive sealing ring 72 is attached and sealed to the ceramic base 52 with a layer 76 of conductive eutectic sealing material.

As described next, the conductive metal lid 68 is connected to Vss/Ground pins of the package so that the lid 68 is not electrically isolated from the ground conductors for this package. Vss/Ground pins 80, 82 for the package are fixed in the base 52 using conventional techniques. The Vss/Ground pins 80, 82 are respectively connected to the ground conductors (typically shown as 84, 86), which are formed within the ceramic base 52. The ground conductors 84, 86 are respectively connected to respective conductive vias 88, 90 which are formed as plated-through holes in the ceramic base 52. The conductive vias 88, 90 provide an electrically conductive path up to the layer 76 of conductive eutectic sealing material. The rest of the electrically conductive path is provided to the conductive lid 68 through the layer 76 of conductive eutectic sealing material, the electrically conductive sealing ring 72, and the preformed layer 74 of gold/tin bonding bonding material.

Figure 4:
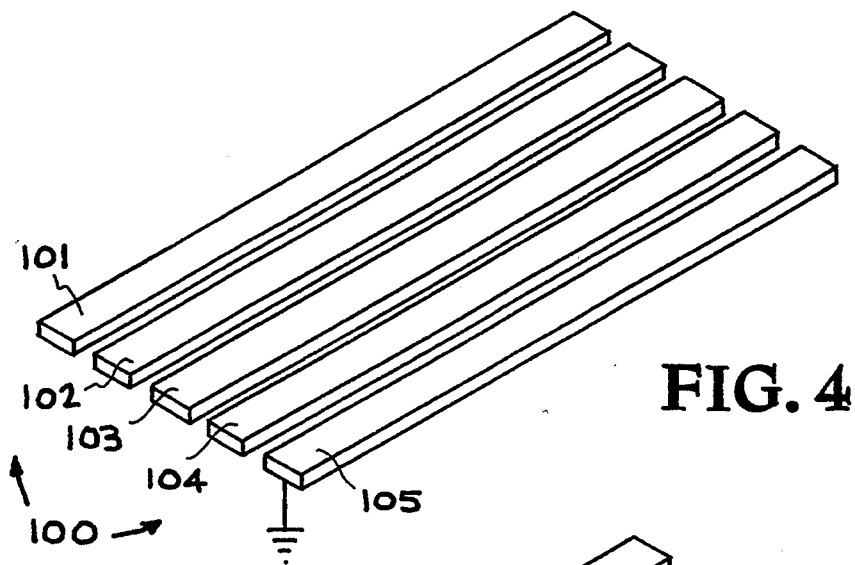
FIG. 4 is an isometric view illustrating several conductors aligned in parallel, where one of the conductors is grounded.
Figure 5:
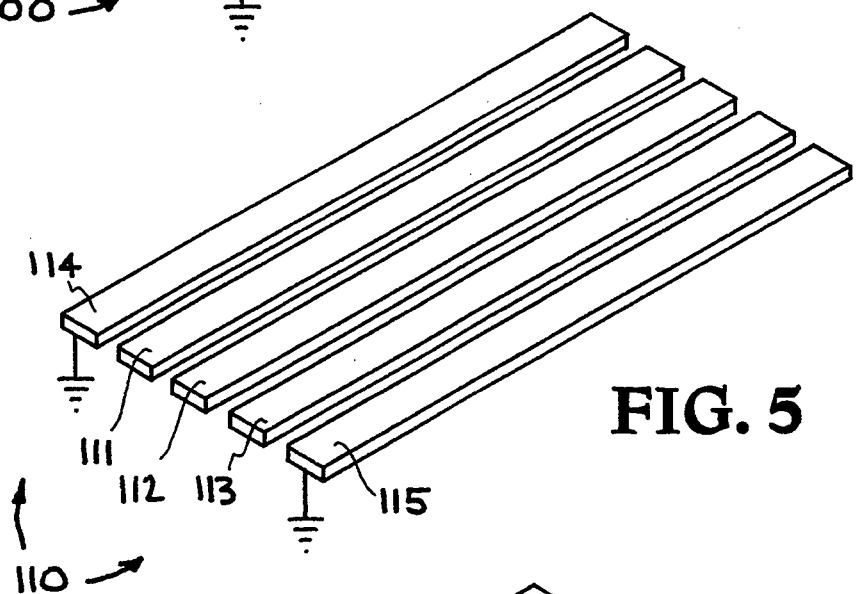
FIG. 5 is an isometric view illustrating several conductors aligned in parallel, where two of the conductors are grounded.
Figure 6:
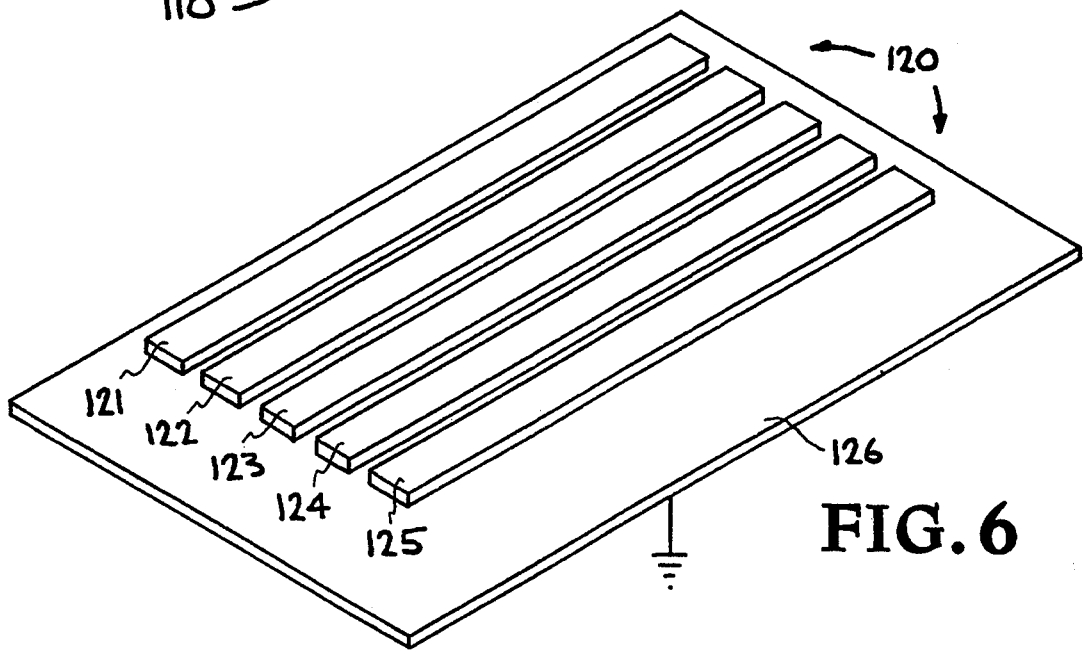
FIG. 6 is an isometric view illustrating several conductors aligned in parallel to a conductive ground plane.

In general, FIGS. 4, 5, and 6 are provided for purposes of illustrating comparative values of mutual and self-inductances for a simulated set of parallel conductors (such as bonding wires) which are arranged in various different spatial relationships with respect to three different reference ground conductors.

FIG. 4 shows a group 100 of several flat conductors aligned side-by-side. Some of the conductors 101, 102, 103, 104 are aligned in parallel and one of the parallel-aligned conductor 105 is grounded. The flat conductors are 10 mils wide by 4 mils thick by 300 mils long. The spacing between conductors is 15 mils. An inductance matrix Table 1 shows the inductances at 1 Mhz between the various conductors as developed using a three-dimensional parasitic simulator program called "Parasitic Parameters" by Pacific Numerix of San Diego, Calif.

The numbers in the rows and columns of the matrix identify the conductors 101, 102, 103, 104. At the intersection of a row and column in the table is the value of the inductance between the row element and the corresponding column element. For example, the mutual inductance $M_{101\text{-}102}$ is 2.90 nonohenrys. The self-inductance $L_{101-101}$ for conductor 101 is 5.88 nonohenrys.

TABLE 1

| | Inductance (nH) at 1 MHz | | | |
|---|---|---|---|---|
| | 101 | 102 | 103 | 104 |
| 101 | 5.88 | 2.90 | 1.85 | 1.11 |
| 102 | 2.90 | 5.64 | 2.62 | 1.43 |
| 103 | 1.85 | 2.62 | 5.28 | 2.06 |
| 104 | 1.11 | 1.43 | 2.06 | 4.43 |

$M_{101\text{-}102}/L_{101-101} = 49\%$
$M_{101\text{-}103}/L_{101-101} = 31\%$

FIG. 5 shows the effect of positioning an additional grounded conductor adjacent to a group 110 of several flat conductors aligned side-by-side. The conductors 111, 112, 113 are aligned in parallel, and now two outside grounded conductors 114, flank the conductors 111, 112, 113. The flat conductors are 10 mils wide by 4 mils thick by 300 mils long. The spacing between conductors is 15 mils. An inductance matrix Table 2 shows the inductances at 1 Mhz between the various conductors 111, 112, 113 as developed using a three-dimensional parasitic simulator program called "Parasitic Parameters" by Pacific Numerix of San Diego, Calif.

TABLE 2

| | Inductance (nH) at 1 MHz | | |
|---|---|---|---|
| | 111 | 112 | 113 |
| 111 | 4.22 | 1.70 | 0.88 |
| 112 | 1.70 | 4.69 | 1.71 |
| 113 | 0.88 | 1.71 | 4.22 |

$M_{111\text{-}112}/L_{111-111} = 40\%$
$M_{111\text{-}113}/L_{111-111} = 21\%$

The numbers in the rows and columns of the matrix identify the conductors. At the intersection of a row and column is provided the inductance between the row element and the column element. For example, the mutual inductance $M_{111\text{-}112}$ between conductors 111 and 112 is 1.70 nanohenrys. The self-inductance $L_{111-111}$ for conductor 111 is 4.22 nanohenrys.

With reference to the arrangement of FIG. 5 and in comparison to the arrangement of FIG. 4, the effect of adding the additional grounded conductor 115 is to decrease the self-inductance of individual conductors and the mutual inductance between conductors. With regard to self-inductance, for example, the self-inductance $L_{101-101}$ of FIG. 4 is 5.88 nanohenrys while the self-inductance $L_{111-111}$ of FIG. 5 is 4.22 nanohenrys. With regard to mutual inductance between conductors, for example, the mutual inductance $M_{101\text{-}102}$ between conductors 101 and 102 of FIG. 4 is 2.90 nanohenrys while the mutual inductance $M_{111\text{-}112}$ between conductors 111 and 112 is 1.70 nanohenrys.

FIG. 6 shows the effect of positioning a group of several flat parallel conductors 121, 122, 123, 124, 125 adjacent to a large conductive plane 126. The flat conductors are 10 mils wide by 4 mils thick by 300 mils long. The spacing between conductors is 15 mils and the spacing between the conductors and the plane 126 is 10 mils. An inductance matrix Table 3 shows the inductances at 1 Mhz between the various conductors 121, 122, 123, 124, 125 as developed using a three-dimensional parasitic simulator program called "Parasitic Parameters" by Pacific Numerix of San Diego, Calif.

TABLE 3

| | Inductance (nH) at 1 MHz. | | | | |
|---|---|---|---|---|---|
| | 121 | 122 | 123 | 124 | 125 |
| 121 | 2.56 | 0.32 | 0.09 | 0.04 | 0.02 |
| 122 | 0.32 | 2.56 | 0.32 | 0.09 | 0.04 |
| 123 | 0.09 | 0.32 | 2.56 | 0.32 | 0.09 |
| 124 | 0.04 | 0.09 | 0.32 | 2.56 | 0.32 |
| 125 | 0.02 | 0.04 | 0.09 | 0.32 | 2.56 |

$M_{121\text{-}122}/L_{121-121} = 13\%$
$M_{121\text{-}123}/L_{121-121} = 4\%$

The numbers in the rows and columns of the matrix identify the conductors. At the intersection of a row and column is provided the inductance between the row element and the column element. For example, the mutual inductance $M_{121\text{-}122}$ between conductors 121 and 122 is 0.32 nanohenrys. The self-inductance $L_{121-121}$ for conductor 121 is 2.56 nanohenrys.

Comparing the inductance values for the arrangement of FIG. 6 with the inductance values of FIG. 4 shows significant decreases in self-inductance and mutual inductances as a result of adding the ground plane 126. With regard to self-inductance, for example, the self-inductance $L_{101-101}$ of FIG. 4 is 5.88 nanohenrys while the self-inductance $L_{121-121}$ of FIG. 6 is 2.56 nanohenrys. With regard to mutual-inductance between conductors, for example, the mutual inductance $M_{101-102}$ between conductors 101 and 102 of FIG. 4 is 2.90 nanohenrys, while the mutual inductance $M_{121-122}$ between conductors 121 and 122 is 0.32 nanohenrys. Using a grounded plane, such as a conductive lid of an integrated circuit package, adjacent to bonding wires would significantly reduce inductances to the bonding wire self-inductances as well as the mutual inductance between bonding wires.

Figure 7:
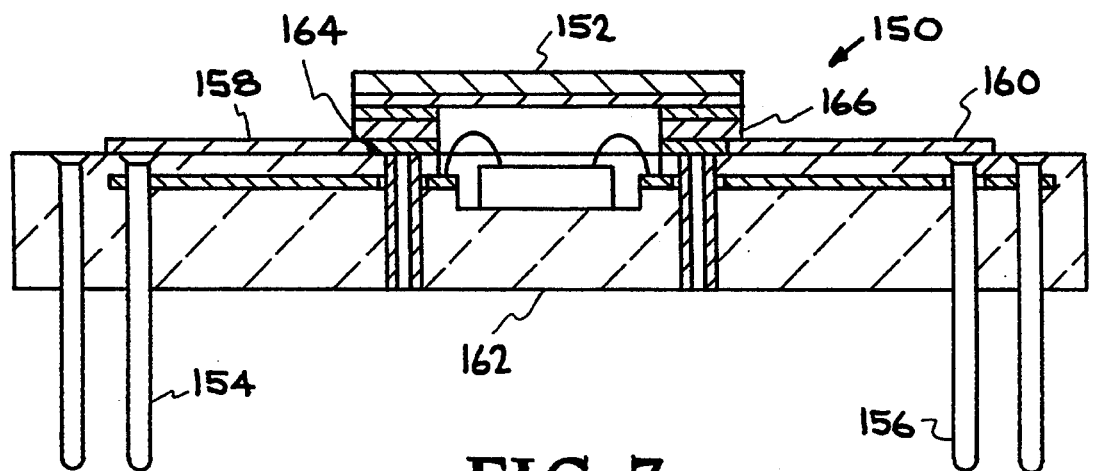
FIG. 7 is a sectional elevation view of an integrated circuit package assembly showing a conductive lid connected through additional conductive tabs to Vss/Ground pins to reduce lead inductance.
Figure 8:
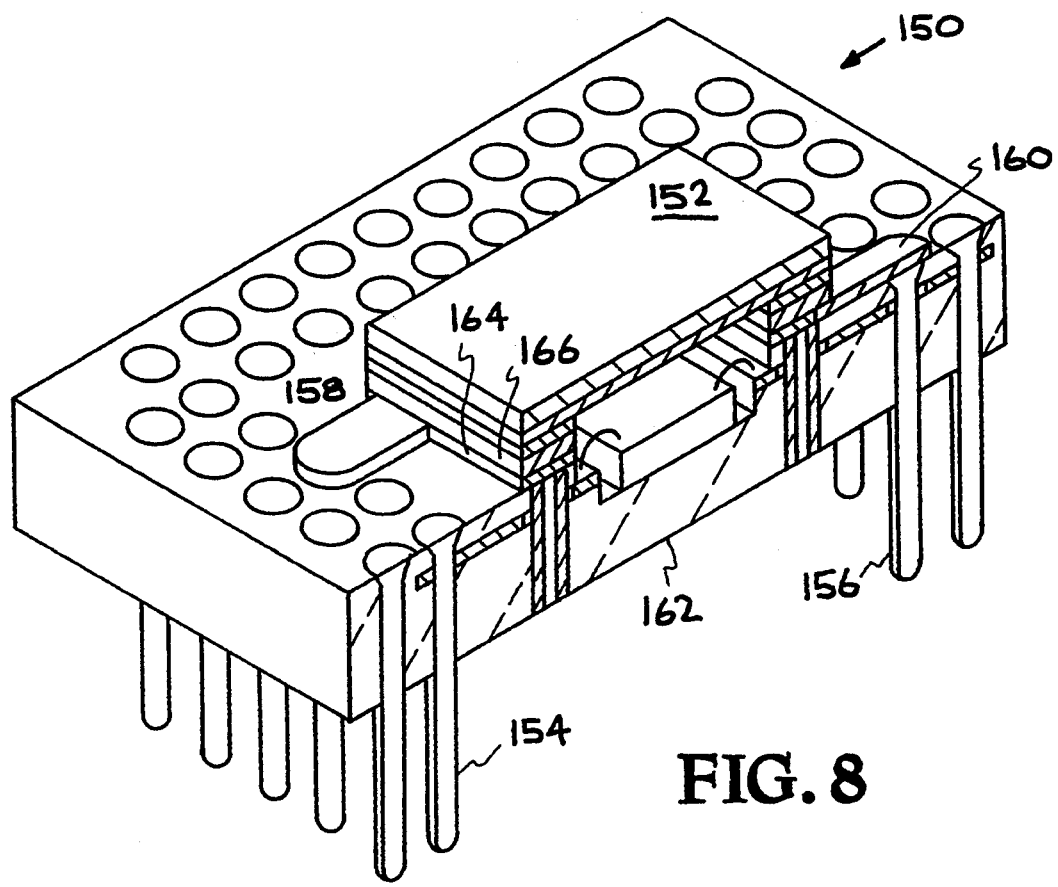
FIG. 8 is an isometric, partially sectional view, taken along section line 8—8 of FIG. 7, showing the additional conductive tabs to connect Vss/Ground pins to the conductive lid.

FIGS. 7 and 8 show an integrated circuit package assembly 150 having an alternative conductive path for connecting a conductive lid 152 to the Vss/ground pins (typically shown as 154, 156) of the package. The alternative path employs conductive tabs 158, 160 which are positioned on the top surface of a ceramic base 162. The conductive tabs 158, 160 are fixed to or extend from an electrically conductive sealing ring 166 which is is bonded to the ceramic base 162 with a layer 164 of conductive eutectic sealing material. This arrangement further reduces lead inductance in the package.

Figure 9:
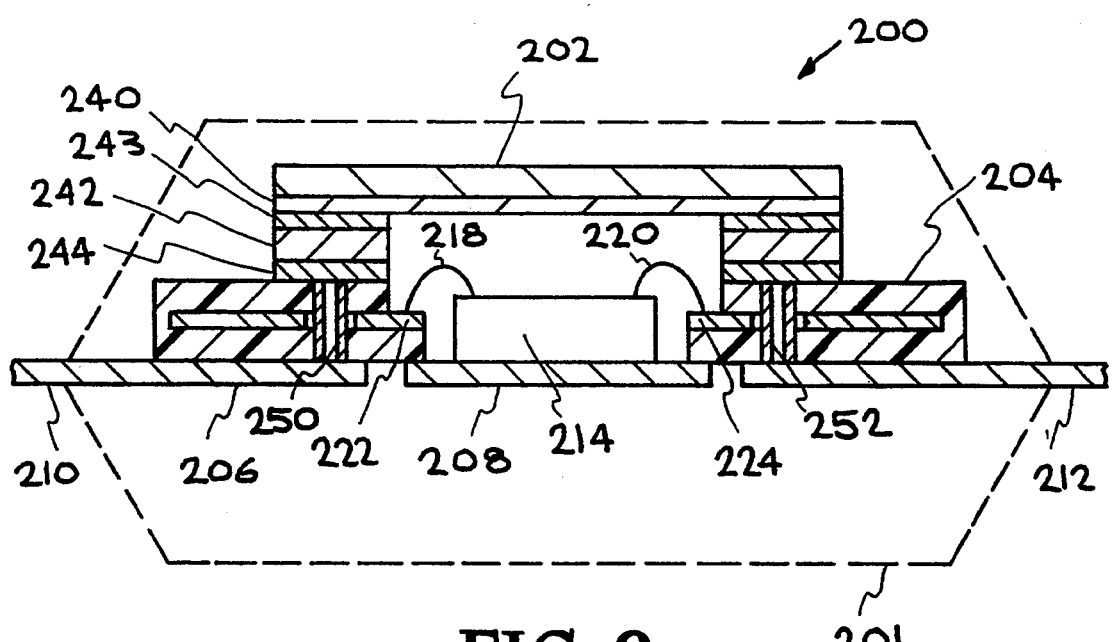
FIG. 9 is a sectional elevational view of a plastic-encapsulated multilayer plastic package configuration having a conductive lid connected to a VV/Ground potential source.
Figure 10:
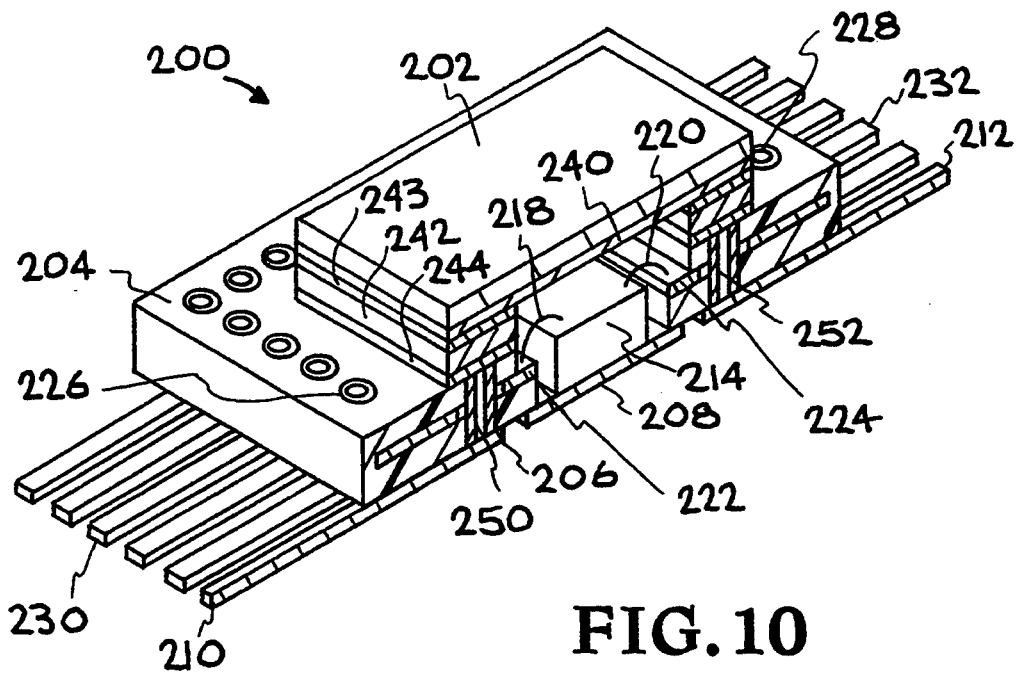
FIG. 10 is an isometric, partially sectional view, taken along section line 10—10 of the multilayer plastic package of FIG. 9 prior to encapsulation.

FIG. 9 illustrates a plastic-encapsulated multilayer plastic package configuration 200 having a conductive lid connected to a Vss/Ground potential source. FIG. 10 illustrates the multilayer plastic package 200 prior to encapsulation.

FIGS. 9 and 10 show a multilayer plastic package arrangement which is intended to be encapsulated with a plastic molding material, as indicated by the line 201. This configuration electrically connects a conductive lid 202 to a VSS/Ground potential source to reduce the bonding-wire inductances and to reduce electromagnetic interference. The package assembly 200 includes a multilayer, printed circuit-board base 204 formed of a layer printed circuit board material such as, for example, FR-4 glass-epoxy, polyimide, or other suitable material. The multilayer, printed circuit-board base 204 is fixed to a leadframe 206, which includes a centrally located die-attach paddle 208 and a number of outwardly extending leads (typically illustrated as 210, 212). An integrated circuit die 214 is fixed to the centrally located die-attach paddle 208. A large number of bonding wires are connected between the die 214 and the ends of the leads. The bonding wires (typically shown as 218, 220) are shown connected between respective bonding pads on the integrated circuit die 214 and corresponding respective bonding pads 222, 224 formed at the end of conductors in the multilayer, printed circuit-board base 204. The conductors in the multilayer, printed circuit-board base 204 extend to plated-through vias (typically shown as 226, 228), where the plated-through vias provide connections between the conductors within the multilayer, printed circuit-board base 204 and respective leads of the lead frame (typically shown as 230, 232).

The conductive metal lid 202 is typically formed of a metal material, such as kovar with a layer 240 of gold formed on its lower surface. The top surface of an electrically conductive sealing ring 242 is bonded to the layer 240 on the lower surface of the lid 202, for example, with a layer 243 of a conductive epoxy bonding material. The lower surface of the electrically conductive sealing ring 242 is attached and sealed to the multilayer, printed circuit-board base 204 with a layer 244 of conductive sealing material, such as a conductive epoxy.

The conductive metal lid 202 is connected to Vss/Ground leads 210, 212 so that the lid 202 is not electrically isolated from the ground conductors for this package. Vss/Ground pins 210, 212 for the package are respectively connected through respective plated-through conductive vias (typically shown as 250, 252). The conductive vias 250, 252 provide an electrically conductive path to the conductive lid 202 through the layer 244 of conductive sealing material, the electrically conductive sealing ring 242, and the layer of conductive bonding material which seals the the lid 202 to the sealing ring 242. This configuration provides for electrically grounding the conductive lid 202 to reduce inductances and to reduce electromagnetic interference.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. An improved package assembly for an integrated-circuit die, comprising:
   a base to which the integrated-circuit die is fixed, said base including a ground-reference conductor;
   one or more bonding wires for the integrated-circuit die, each of said one or more bonding wire connected between a respective bonding pad on the integrated-circuit die and a corresponding bonding pad on the base;
   a conductive lid overlying the one or more bonding wires for the integrated-circuit die; and
   connection means for electrically connecting the conductive lid to the ground-reference conductor so that the electrically conductive lid reduces both the self inductances of the one or more bonding wires and the mutual inductance between the one or more bonding wires and also so that the lid is grounded to reduce interference being radiated from the electrically conductive lid.

2. The improved package assembly of claim 1 wherein the base includes multilevel conductors for providing electrical connections between terminals fixed to the base and the bonding pads on the base.

3. The improved package assembly of claim 2:
   wherein the base is a nonconductive base having a ground-reference conductor;
   wherein the connection means includes conductive means for fixing the conductive lid to the base;
   wherein the connection means includes conductive vias formed in the base, wherein the conductive vias are connected to the conductive means for fixing the conductive lid to the base and the ground-reference conductor of the base, so that the conductive lid is electrically connected to the ground reference conductor of the base.

4. The improved package assembly of claim 3:
   wherein the base is for a pin-grid-array (PGA) package having a number of connection pins extending through the base;

wherein the connection means further includes a conductive tab member formed on surface of the base for a pin-grid-array (PGA) package; and means for connecting the conductive tab member to the conductive lid and one of said number of connection pins.

5. The improved package assembly of claim 2:

wherein the base includes said integrated-circuit being fixed to the die-attached paddle of the lead frame;

wherein the lead frame includes bonding fingers to which respective bonding wires are bonded;

wherein the connection means includes means for fixing the conductive lid to the multi-level printed-circuit board;

wherein the connection means includes conductive plated-through holes formed in the multi-level printed-circuit board, so that the conductive lid is electrically connected to the ground reference conductor.

6. A package for an integrated circuit die, comprising:

a base adapted to having an integrated circuit die fixed thereto, where said integrated circuit die is adapted to having one or more bonding wires fixed thereto, said base having a ground-reference conductor;

a conductive lid adapted to being fixed to said base so that said lid overlies the one or more bonding wires; and connection means for electrically connecting the electrically conductive lid to the ground-reference conductor of the base so that the electrically conductive lid functions to reduce both the self-inductances of the one or more conductors and the mutual inductance between the one or more conductors, and so that the electrically conductive lid is grounded to reduce the amount of electromagnetic interference being radiated from the electrically conductive lid.

7. The package of claim 6 wherein the base is formed of nonconductive material and wherein the connection means for electrically connecting the electrically conductive lid to the ground-reference conductor of the base includes conductive vias formed in said base.

8. The package of claim 7 wherein the base includes a multi-level printed-circuit board which is fixed to a die-attached paddle of a lead frame and wherein the connection means for electrically connecting the electrically conductive lid to the ground-reference conductor of the base includes conductive plated-through holes formed in the multi-level printed-circuit board.

9. A method for packaging an integrated-circuit, comprising the steps off mounting an integrated-circuit die within a cavity formed in a base of a package, where the base has a ground-reference conductor;

connecting the integrated-circuit die to the base with one or more bonding wires;

fixing a conductive lid over the integrated-circuit die in close proximity to the one or more bonding wires;

electrically connecting the electrically conductive lid to the ground-reference conductor of the base so that the electrically conductive lid reduces both the self inductances of the one or more bonding wires and the mutual inductance between the one or more bonding wires and also so that the lid is grounded to reduce interference being radiated from the electrically conductive layer.

10. The method of claim 9:

wherein the step of mounting an integrated circuit die within a cavity formed in a base of a package includes mounting the integrated circuit die within a cavity formed in a base of a package which has multilevel conductors formed therein;

wherein the step of electrically connecting the electrically conductive lid to the ground-reference conductor of the base includes the step of connecting through conductive vias formed in the base and through conductive means for fixing the conductive lid to the base so that the conductive lid is electrically connected to the ground reference conductor of the base.

11. An improved package assembly for an integrated-circuit die, comprising:

a ceramic base to which the integrated-circuit die is fixed, said ceramic base including a ground-reference conductor, and bonding pads formed thereon, said base including multi-level conductors for providing electrical connections between terminals fixed to said ceramic base and said bonding pads on the base;

one or more bonding wires for the integrated-circuit die, each of said one or more bonding wire connected between a respective bonding pad on the integrated-circuit die and a corresponding bonding pad on the ceramic base;

a conductive lid overlying the one or more bonding wires for the integrated-circuit die; and connection means for electrically connecting the conductive lid to the ground-reference conductor so that the electrically conductive lid reduces both the self inductances of the one or more bonding wires and the mutual inductance between the one or more bonding wires and also so that the lid is grounded to reduce interference being radiated from the electrically conductive layer, said connection means including conductive means for fixing the conductive lid to the ceramic base, said connection means including conductive vias formed in the ceramic base, wherein the conductive vias are connected to the conductive means for fixing the conductive lid to the ceramic base and the ground-reference conductor of the base, so that the conductive lid is electrically connected to the ground reference conductor of the ceramic base.

12. An improved package assembly for an integrated-circuit die, comprising:

a ceramic base to which the integrated-circuit die is fixed, said ceramic base including a ground-reference conductor, said ceramic base for a ceramic pin-grid-array (PGA) package having a number of connection pins extending through the ceramic base, said ceramic base having bonding pads formed thereon, said base including multi-level conductors for providing electrical connections between terminals fixed to said ceramic base and said bonding pads on the base;

one or more bonding wires for the integrated-circuit die, each of said one or more bonding wire connected between a respective bonding pad on the integrated-circuit die and a corresponding bonding pad on the ceramic base;

a conductive lid overlying the one or more bonding wires for the integrated-circuit die; and connection means for electrically connecting the conductive lid to the ground-reference conductor so that the electrically conductive lid reduces both the self inductances of the one or more bonding wires and the mutual inductance between the one or more bonding wires and also so that the lid is grounded to reduce interference being radiated from the electrically conductive lid, said connection means including conductive means for fixing the conductive lid to the ceramic base, said connection means including conductive vias formed in the ceramic base, wherein the conductive vias are connected to the conductive means for fixing the conductive lid to the ceramic base and the ground-reference conductor of the base, so that the conductive lid is electrically connected to the ground reference conductor of the ceramic base said connection means further including a conductive tab member formed on the surface of the ceramic base for said ceramic pin-grid-array (PGA) package, and means for connecting the conductive tab member to the conductive lid and one of said number of connection pins.

13. An improved package assembly for an integrated-circuit die, comprising:
a base to which the integrated-circuit die is fixed, said base including a ground-reference conductor, said base including multi-level conductors for providing electrical connections between terminals fixed to the base and the bonding pads on the base said base including said integrated-circuit being fixed to the die-attached paddle of a lead frame, said lead frame including bonding fingers to which respective bonding wires are bonded;
one or more bonding wires for the integrated-circuit die, each of said one or more bonding wires connected between a respective bonding pad on the integrated-circuit die and a corresponding bonding pad on the base;
a conductive lid overlying the one or more bonding wires for the integrated-circuit die; and
connection means for electrically connecting the conductive lid to the ground-reference conductor so that the electrically conductive lid reduces both the self inductances of the one or more bonding wires and the mutual inductance between the one or more bonding wires and also so that the electrically conductive lid is grounded to reduce interference being radiated from the electrically conductive layer, said connection means includes means for fixing the conductive lid to the multi-level printed-circuit board said connection means further including conductive plated-through holes formed in the multi-level printed-circuit board, so that the conductive lid is electrically connected to the ground reference conductor.

14. A package for an integrated-circuit die, comprising:
a base adapted to having an integrated-circuit die fixed thereto, where said integrated-circuit die is adapted to having one or more bonding wires fixed thereto, said base having a ground-reference conductor, said base formed of a ceramic material;
a conductive lid adapted to being fixed to said base so that said lid overlies the one or more bonding wires; and
connection means for electrically connecting the electrically conductive lid to the ground-reference conductor of the base so that the electrically conductive lid functions to reduce both the self inductances of the one or more conductors and the mutual inductance between the one or more conductors and so that the electrically conductive lid is grounded to reduce the amount of electro-magnetic interference being radiated from the electrically conductive lid, said connection means including conductive vias formed in said base.

15. A package for an integrated-circuit die, comprising:
a base adapted to having an integrated-circuit die fixed thereto, where said integrated-circuit die is adapted to having one or more bonding wires fixed thereto, said base having a ground-reference conductor, said base formed of a ceramic material, said base including a multi-level printed-circuit board fixed to a die-attached paddle of a lead frame;
a conductive lid adapted to being fixed to said base so that said lid overlies the one or more bonding wires; and
connection means for electrically connecting the electrically conductive lid to the ground-reference conductor of the base so that the electrically conductive lid functions to reduce both the self inductances of the one or more conductors and the mutual inductance between the one or more conductors and so that the electrically conductive lid is grounded to reduce the amount of electro-magnetic interference being radiated from the electrically conductive lid, said connection means including conductive plated vias formed in said multi-level printed-circuit board.

* * * * *